United States Patent [19]
Vandling

[11] 3,983,321
[45] Sept. 28, 1976

[54] SWITCHING CICUIT UTILIZING A BASE STORAGE CHARACTERISTICS OF A TRANSISTOR FOR USE IN A FACSIMILE TRANSCEIVER AND THE LIKE

[75] Inventor: John M. Vandling, Pleasantville, N.Y.

[73] Assignee: Exxon Research and Engineering Company, Linden, N.J.

[22] Filed: July 30, 1974

[21] Appl. No.: 493,118

[52] U.S. Cl. ............................. 178/7.6; 178/69.5 F; 318/330; 307/254
[51] Int. Cl.² ......................................... H04N 1/36
[58] Field of Search ....................... 178/69.5 F, 7.6; 318/314, 327, 329, 330

[56] References Cited
UNITED STATES PATENTS
3,390,231  6/1968  Youngquist ..................... 178/69.5 F
3,670,105  6/1972  Houck ............................ 178/69.5 F

*Primary Examiner*—Howard W. Britton
*Attorney, Agent, or Firm*—Woodcock Washburn Kurtz & Mackiewicz

[57] ABSTRACT

A document/copy carrying drum of a facsimile transceiver is rotatably driven by a synchronous motor. The synchronous motor is connected as a load in series with a first transistor and a first power supply of one polarity. The synchronous motor is also connected in series with a second circuit and a second power supply of opposite polarity so as to apply DC voltages of opposite polarity during alternate conduction of the transistors. Conduction of the transistors is controlled by alternately applying a series of relatively low voltage pulses to the bases of the transistors through high frequency isolation transformers. The pulses are separated by a time interval less than the base storage time of the transistors so as to assure continuous conduction between the collector and emitter of a transistor while a series of pulses is applied to the base thereof.

10 Claims, 4 Drawing Figures

SWITCHING CIRCUIT UTILIZING A BASE STORAGE CHARACTERISTICS OF A TRANSISTOR FOR USE IN A FACSIMILE TRANSCEIVER AND THE LIKE

BACKGROUND OF THE INVENTION

This invention relates to the switching control of relatively high voltage, DC or low frequency, signals with relatively low voltage, high frequency, pulses. This invention also relates to the use of such control to provide a stable frequency power supply for facsimile transceivers and the like.

In many applications, it is desirable to provide switching control of DC or low frequency sources of relatively high voltages. This control may be provided by digital logic circuitry. However, suitable precautions should be taken to isolate the low voltage logic circuitry from the high voltage source, and such precautions can be rather costly.

One particularly important application of the foregoing is facsimile transceivers wherein it is desirable to provide a stable frequency power supply for the synchronous motor which drives the rotatably mounted, document/copy carrying drum of the transceiver. As shown in U.S. Pat. No. 3,582,550 - Latanzi, the output from a stable frequency oscillator is applied to a frequency generator comprising a series of logic elements which produces a periodic pulse which is applied through gate means to control the synchronous motor. Thus, the Latanzi patent discloses a circuit wherein logic elements are utilized to achieve a relatively high voltage, stable frequency power supply. It does not however disclose any means by which isolation may be achieved between the logic circuitry and a high voltage power supply.

SUMMARY OF THE INVENTION

It is an object of this invention to provide low voltage control of high voltage AC or DC signals with small, efficient and low cost isolation means between the low voltage and the high voltage signals.

It is also an object of this invention to utilize such switching control to provide a stable frequency power supply for a facsimile transceiver.

In accordance with these and other objects, a preferred embodiment of the invention in a facsimile transceiver comprises a source of low voltage, substantially constant frequency pulses separated by substantially constant time intervals. Pulse control means are coupled to the source and the input of high voltage isolation means for controlling the application of pulses to the input of the isolation means. A switching transistor having a base, an emitter and a collector, and characterized by a base storage time exceeding the time interval between the low voltage pulses, is coupled at the base to the output of the isolation means so as to render the transistor conductive between the emitter and collector during the pulses and during the intervals between the pulses.

In accordance with one important aspect of the invention, the pulse control means applies an open circuit to the input of the isolation means upon the absence of pulses from the source thereby protecting the isolation means from the continuous application of a DC signal.

In a particularly preferred embodiment of the invention, a pair of isolation means and a pair of transistors are provided. The pulse control means also includes means for alternately applying a series of pulses to one and then the other of the pair of transistors so as to alternately render the pair of transistors conductive. A pair of power supplies may be connected with opposite polarity in a series circuit with the emitter-collector circuits of the pair of transistors. Such a circuit may be utilized as a stable AC power supply with a synchronous motor of a facsimile transceiver by connecting the motor across the series circuit.

In order to assure that the pair of transistors do not conduct simultaneously, the pulse control means may include a pair of gate means coupled to the respective inputs of the pair of isolation means. Means may also be provided for alternately enabling the pair of gate means and for simultaneously inhibiting both of the pair of gate means immediately prior to enabling one of the pair of gate means. The means for alternately enabling the pair of gate means may comprise logic circuitry which changes state while both of the gate means are inhibited.

DETAILED DESCRIPTION OF A PREFERRED EMBODIMENT

Figure 1:
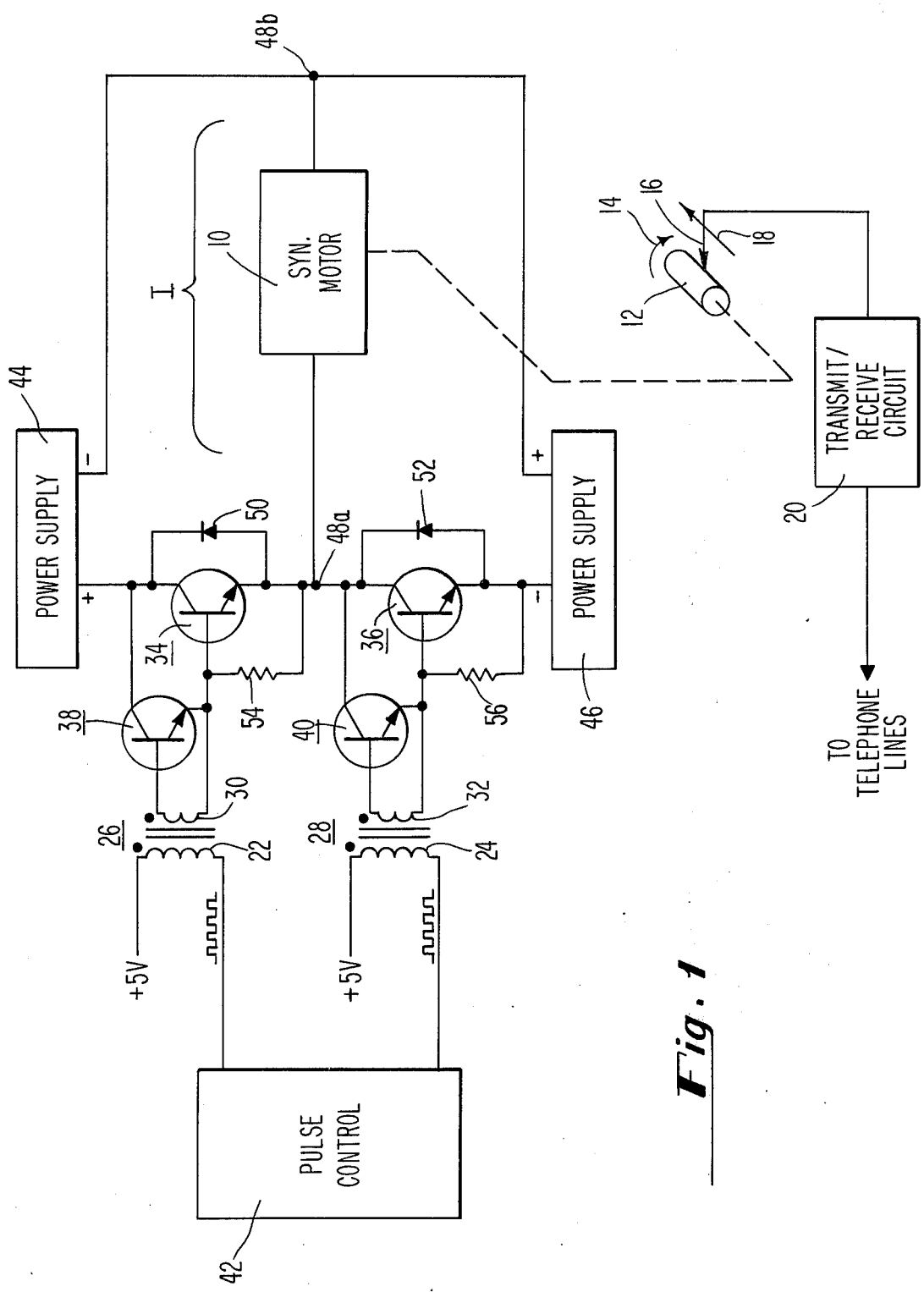
FIG. 1 is a schematic diagram of the switching circuitry of this invention embodied in a facsimile transceiver.

Referring to FIG. 1, a facsimile transceiver comprises a rotatably mounted drum 12 rotated through various angular positions by a synchronous motor 10 in the direction indicated by the arrow 14 so as to create a relative scanning movement between the document circumscribing the drum 12 and a transducer 16 which has a reading capacity which may be provided by a photodetector and a writing capacity which may be provided by a stylus. Additional scanning movement between the transducer 16 and the document or copy carried by the drum 12 is achieved by moving the transducer 16 parallel with the axis of the drum 12 as indicated by the arrow 18 so as to allow the entire surface of the document or copy medium to be scanned.

The transducer 16 is coupled to a transmit/receive circuit 20. The circuit 20 includes a demodulator and amplifier for energizing the stylus of the transducer 16 in accordance with signals received over the transmission link such as the telephone lines indicated in FIG. 1. In addition, the circuit 20 includes amplifier and modulation circuitry for transmitting signals representing the information content of a document carried by the drum 14 as detected by the photodetector of the transducer 16.

In accordance with this invention, a series of low voltage pulses are alternately applied to primaries 22 and 24 of isolating transformers 26 and 28. Secondaries 30 and 32 are connected to the bases of switching transistors 38 and 40 so as to alternately render the collector-emitter circuits of the transistors 34 and 36 alternately conductive on alternate series of pulses. By providing sufficiently high frequency pulses with sufficiently small intervals between the pulses, the transistors 34 and 36 will continually conduct during the interval between the pulses applied to the transistors 34 and 36 due to the base storage characteristics of the transistors 34 and 36. Since the isolation transformers 26 and 28 do not provide sufficient current in the secondaries 30 and 32 to drive the bases of the transistors 34 and 36 directly, the transistors 38 and 40 are connected in a Darlington configuration with transistors 34 and 36. The transistors 38 and 40 then develop the necessary base current for the transistors 34 and 36 to insure their complete saturation.

In the particular preferred embodiment of the invention shown in FIG. 1, a series of pulses under the control of a pulse control means 42 are alternately applied to the bases of the transistors 34 and 36 so as to alternately render the emitter-collector circuits of these transistors conductive. The emitter-collector circuits of the transistors 34 and 36 are then connected in series with oppositely poled, high voltage (relative to the low voltage pulses) power supplies 44 and 46. The synchronous motor 10 is then connected across the series circuit between a first terminal 48a and a second terminal 48b so as to be driven by a positive and negative going squarewave having a peak-to-peak value equal to the sum of the power supply voltages.

Since the synchronous motor may have a power factor of approximately 50% representing a highly inductive load which will store a considerable amount of energy that must be dissipated electrically during the first portion of each half cycle of the squarewave, diodes 50 and 52 are provided to return the excess stored energy to one or the other of the power supplies 42 and 44. Resistors 54 and 56 connected from the base to the emitter of transistors 34 and 36 provide a DC return path so that the transistor collector to base leakage does not tend to cause forward conduction in a transistor that should be in the off state.

In order to generate a squarewave by alternate conduction of the transistors 34 and 36, it is necessary to alternately apply a series of pulses to the primaries 22 and 24 of the transformers 26 and 28. This is accomplished by the pulse control means 42 which will now be described in detail with reference to FIG. 2.

Figure 2:
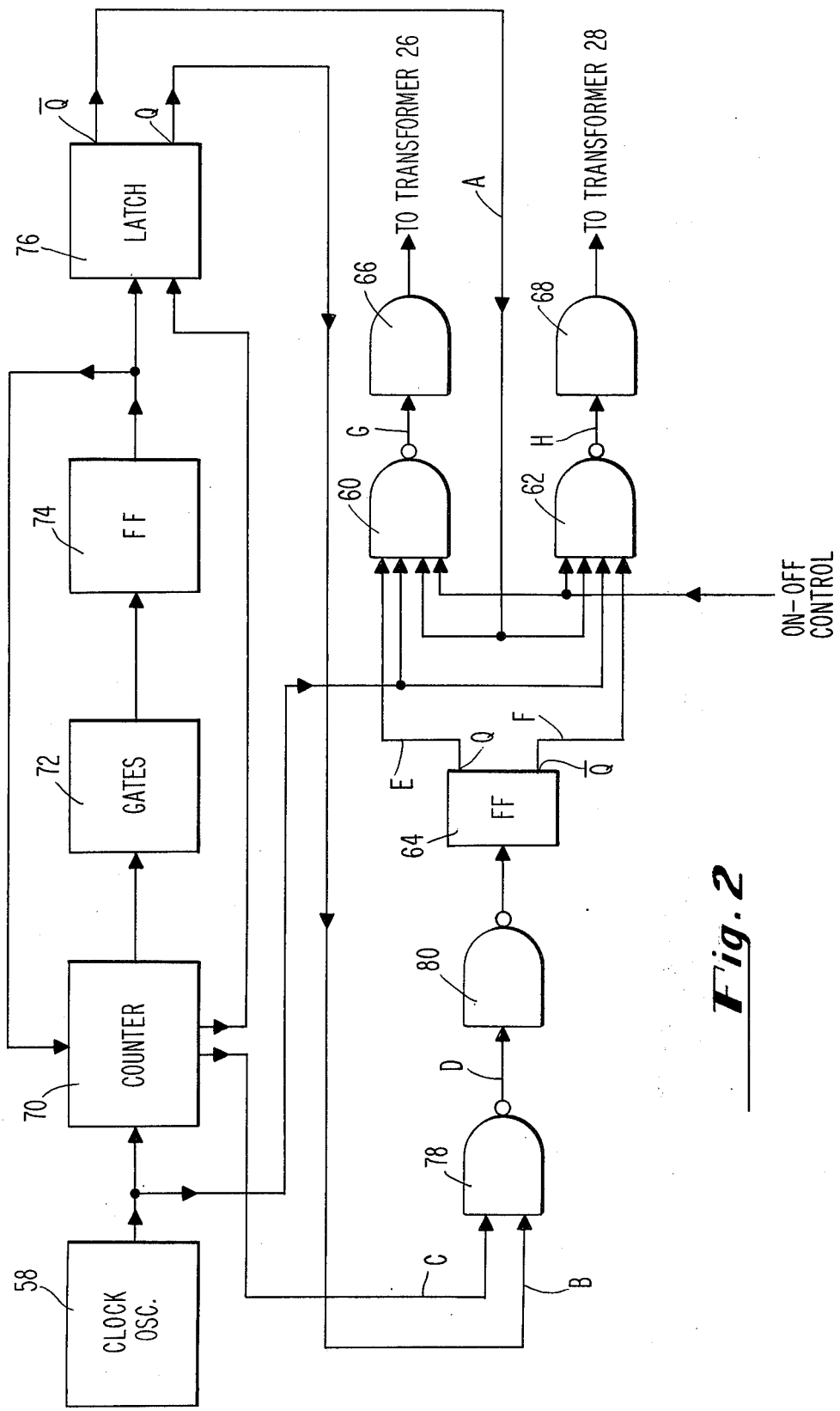
FIG. 2 is a schematic diagram of the logic circuitry for controlling the switching circuitry of FIG. 1.

As shown in FIG. 2, a clock oscillator 58 generates high frequency pulses which are applied directly to a pair of NAND gates 60 and 62 which are alternately enabled by the out-puts of flip-flop 64. The alternate series of pulses from the NAND gates 60 and 62 are then applied to AND gate drivers 66 and 68 respectively for application to the primaries 22 and 24 of the transformers 26 and 28 shown in FIG. 1.

The state of the flip-flop 64 and thus the enabling of the NAND gates 60 and 62 is controlled in response to the count accumulated in a counter 70 which is also coupled to the output of the clock oscillator 58. Each time the count of pulses from the clock oscillator 58 reaches a predetermined number corresponding to a half cycle of the squarewave, gates 72 connected to the output from the counter 70 will be enabled so as to trigger a flip-flop 74 which sets a latch 76. The Q output of the latch 76 is coupled to a NAND gate 78 which is connected to the flip-flop 64 through an inverting NAND gate 80, and the counter 70 is reset by the output from the flip-flop 74.

In accordance with one important aspect of the invention, the NAND gates 60 and 62 are inhibited momentarily at each setting of the latch 76 so as to preclude the extremely detrimental simultaneous conduction of the transistors 34 and 36. For this purpose, the Q output from the latch 76 is applied directly to the NAND gates 60 and 62 so that the latch 76 when initially set by an output pulse from the flip-flop 74 will inhibit the NAND gates 60 and 62 for the duration of the period which latch 76 remains in the set condition. The duration of the inhibiting Q latch pulse is determined by applying an output from the counter 70 to the latch 76 for resetting the latch 76. The duration of the pulse from the latch 76 is determined so as to be longer than the base storage time of the transistors 34 and 36. During the Q inhibiting pulse, a pulse from the counter 70 is applied to the NAND gate 78 so as to trigger the flip-flop 64 to the opposite state in readiness for the termination of the Q inhibiting pulse. Preferably, the pulse from the counter 70 which enables the NAND gate 78 is initiated midway through the Q inhibiting pulse to assure that the flip-flop 64 is triggered to the other state before the inhibiting Q pulse terminates. In the particularly preferred embodiment, the latch 76 is reset in response to a count in the counter 70 which accumulates after 64 microseconds while the NAND gate 78 is enabled in response to a count in the counter 70 which accumulates after 32 microseconds.

The relationship between the Q inhibit and other signal levels of the circuit shown in FIG. 2 wil now be described in detail with respect to the waveform diagram shown in FIG. 3. Waveform A represents the Q output of the latch 76 which is utilized to enable the NAND gate 78 while waveform B corresponds to the inhibiting Q pulses which are applied directly to the NAND gates 60 and 62 at the half cycle. Waveform C represents the pulses from the counter 70 which are also applied to the NAND gate 78. It will be noted that the signal of the waveform C is "low" at the half cycle designated by the vertically extending broken lines and does not go "high" until midway through the pulses of waveform A which are also applied to the NAND gate 78. Accordingly, the NAND gate 78 is not enabled to produce the pulse of waveform D until halfway through the enabling pulses of waveform A which represent the Q output of the latch 76.

Once enabled, the output of NAND gate 78 goes "low" as shown in waveform D until the arrival of the next positive going edge of waveform C so as to produce a signal at the Q output of flip-flop 64 as shown in waveform E and a signal at the Q output of flip-flop 64 as shown in waveform F. Note that flip-flop 64 only changes state during the inhibiting pulses B. Since the NAND gates 60 and 62 remain inhibited during the pulses of waveform B, the pulses from the clock oscillator 58 are not applied to the transformers 26 and 28 until the end of the inhibiting pulses B even though the flip-flop 64 has changed states.

As the transistors 34 and 36 alternately conduct with neither transistor conducting during the inhibit period at the start of each half cycle, the voltage represented by the waveform I is generated between terminals 48a and 48b. Where the load 10 comprises a synchronous motor which represents an inductive load, the inhibit periods at axis crossing time as shown in waveform I are eliminated since the diodes 50 and 52 will conduct during and after the inhibit period. The length of time of conduction after the inhibit period will be determined by the inductive load characteristics and the length of time necessary to return excess energy to the power supply by way of either diodes 50 or 52. Accordingly, the voltage across the terminals 46 and 48 more closely resembles a conventional squarewave.

Figure 3:
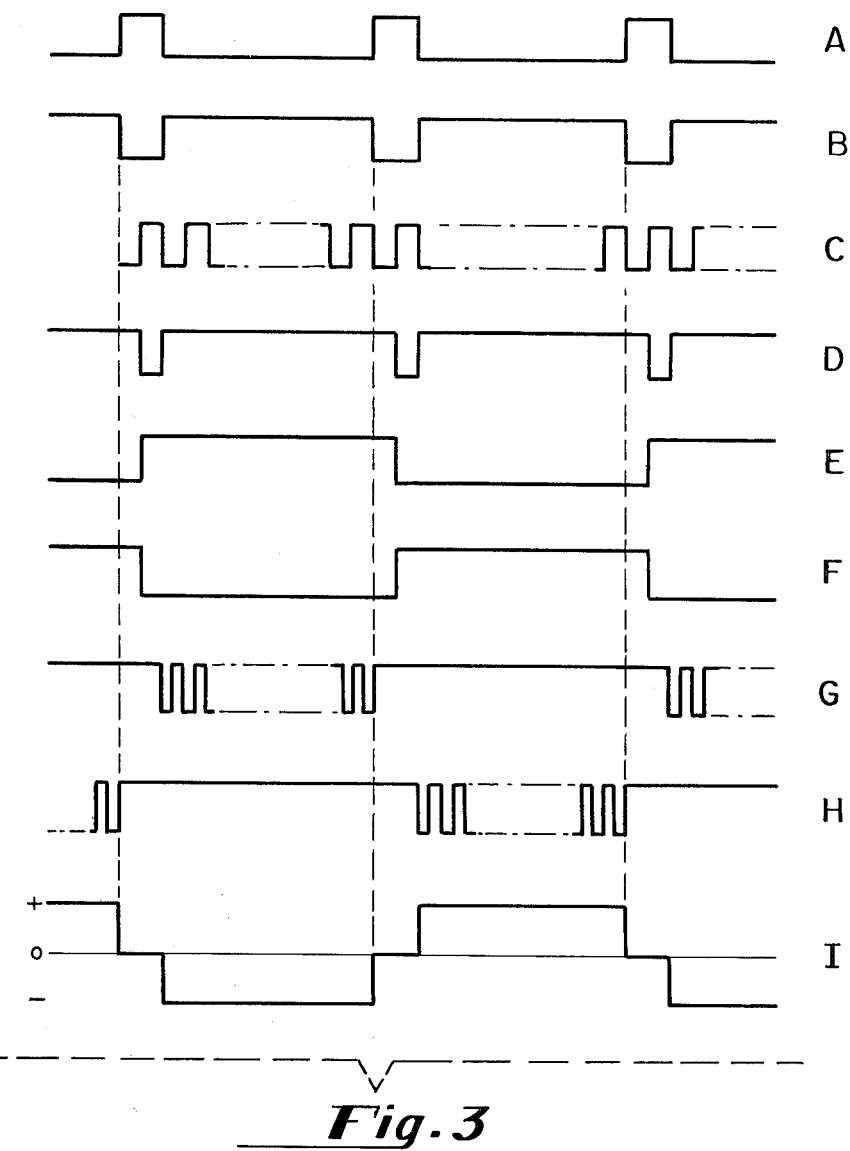
FIG. 3 is a waveform diagram utilized in the detailed description of the circuitry in FIGS. 1 and 2.

As shown in FIG. 3, the voltage waveform I across the terminals 48a and 48b of FIG. 1 goes to zero at the half cycle points indicated by the broken vertical lines which coincide with the end of each pulse in a series of pulses in waveforms G and H. It will be appreciated that this is not strictly accurate since, as noted previously, the transistors do have a base storage characteristic which is relied upon in generating a generally squarewave signal applied to the load.

Figure 4:
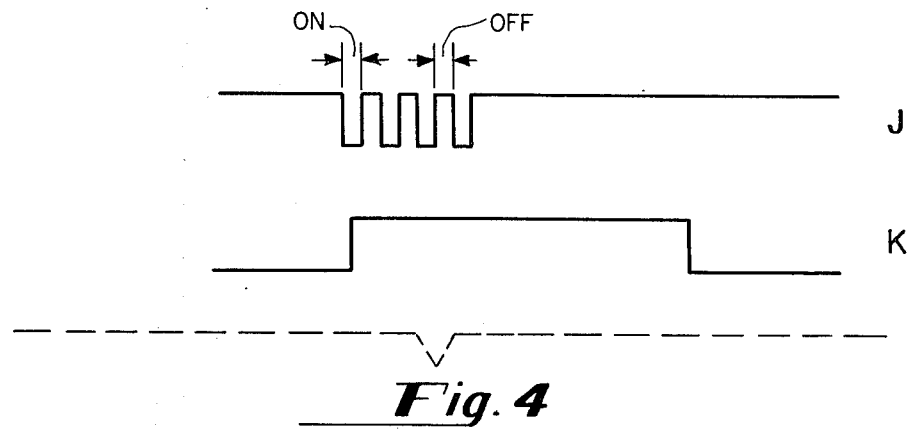
FIG. 4 is a waveform diagram illustrating the effects of the transistor base storage characteristic.

In FIG. 4, the conduction of each transistor in response to the pulses from the NAND gates 60 and 62 is illustrated. As shown there, the first pulse of waveform J which is produced when the enabled NAND gate 60 turns the transistor on as represented by the waveform K. In other words, pulse represented by the "low" state of the signal in waveform J corresponds to the on state of the transistor while the interval between pulses presented by the "high" state of the waveform J corresponds to the off state of the transistor in the abosense of any base storage characteristic. However, due to the very short interval between the pulses, the transistor continues to conduct even though the signal of the waveform J has returned to the high state. Moreover, the transistor continues to conduct as clearly shown in waveform K after the last pulse of the waveform J due to the base storage characteristic of the transistor which will delay the axis crossing of the squarewave in waveform I.

Although the precise relationship between the base storage time and the period between pulses from the clock oscillator 58 may vary, it is preferable to utilize a base storage time which is large relative to the off portion of the clock oscillator pulses. For example, a typical base storage time of approximately 10 microseconds is preferable when utilizing a 2 megahertz pulse train having a one-fourth microsecond off portion.

In order to assure that the absence of pulses will not result in the continuous application of a DC current through the primaries of the transformers 26 or 28, a pulse control means 40 provides an open circuit in the primaries of transformers 26 and 28 in the absence of pulses from gates 60 and 62. This open circuit is provided by AND gates 66 and 68 when the input to each of AND gates 66 and 68 shown in FIGS. 2 is driven to a high state.

From the foregoing, it will be understood that the invention provides a switching control of low frequency AC or DC signals by means of small, efficient, low-cost, high frequency driver-isolation transformers 26 and 28. However, it will also be appreciated that other low-cost isolation means may be utilized including suitable optical isolating elements such as LED light emitting diodes with relatively fast response times coupled to photodetectors which may be utilized to cause conduction in high voltage switching transistors.

Although the illustrated embodiment of the invention discloses a pair of transistors 34 and 36 for use in driving the synchronous motor of a facsimile transceiver, it will be understood that the invention may be utilized in other applications including those wherein a single transistor is utilized. More particularly, the invention is applicable to any circuit wherein it is desirable to provide switching control of relatively high voltages characterized by a low frequency including DC signals by utilizing relatively low voltage, high frequency signals.

Various transistors may be utilized in a switching control circuit of this type. The primary requirements of the transistors is that the base storage time exceed the off period of the relatively high frequency drive pulses. For example, a ratio of two-to-one is usable while a ratio of at least four-to-one is preferred. Suitable, commercially available transistors for the circuit of FIG. 1 include 2N6308 which are characterized by base storage times of approximately 6 to 8 microseconds with the moderate base current supplied by the circuit of FIG. 1.

Although the details of the counter 70, the gate 72, the flip-flop 74 and the latch 76 have not been shown in detail in FIG. 2, these components are described in substantially more detail in copending application Ser. No. 493,119 filed July 30, 1974; now abandoned in favor of Ser. No. 767,369 filed Apr. 12, 1976, assigned to the assignee of this invention. As shown therein, the frequency of the drive signal may be varied by selectively enabling different gate elements in the gate circuit 72 shown in FIG. 2 herein. The various aspects of the counter 70, the gate circuit 72, the flip-flop 74 and the latch 76 are incorporated herein by reference as well as the specific means by which the frequency of the drive signal may be varied in order to achieve margin synchronization.

Although a preferred embodiment of the invention has been shown and described and various modifications suggested, it will be understood that other modifications and embodiments fall within the true spirit and scope of the invention as set forth in the appended claims.

What is claimed is:

1. A facsimile unit comprising scanning means, a motor for driving said scanning means, and information transducer means, the improvement comprising:
   clock means for generating low voltage pulses of substantially constant frequency separated by a substantially constant time interval;
   counter means coupled to said clock means for accumulating a count representing the number of pulses applied to said counter means;
   a pair of high voltage isolation means having an input and an output respectively;
   pulse control means coupled to said clock means and each said input of said pair of high voltage isolation means for controlling the application of clock pulses to said high voltage isolation means, said pulse control means also being coupled to said counter means for alternately applying a series of said pulses to each said input in response to the count accumulated in said counter;
   a pair of transistors having a base, an emitter and a collector respectively, each of said transistors being characterized by a base storage time exceeding said time intervals between said low voltage pulses, each said base being coupled to each said output of said high voltage isolation means respectively so as to alternately render said transistors conductive between said emitter and said collector during said pulses and during said intervals between said pulses; and
   a pair of power supplies connected in series circuit with said emitter and said collector of each said pair of transistors, said power supplies being connected with opposing polarities, and synchronous motor being connected across said series circuit from a first terminal between said transistors and a second terminal between said power supplies.

2. The facsimile unit of claim 1 further comprising a pair of driver transistors, each of said driver transistors coupling each said base of said pair of transistors to said isolation means.

3. The facsimile unit of claim 1 wherein said pulse control means comprises:
   a pair of gate means coupled to the respective inputs of said pair of isolation means;
   means for alternately enabling said pair of gate means in response to the count accumulated in said counter; and
   means for simultaneously inhibiting both of said pair of gate means immediately prior to enabling one of said pair of gate means.

4. The facsimile unit of claim 3 wherein said means for alternately enabling said pair of gate means changes state while both of said gate means are inhibited.

5. A facsimile unit comprising scanning means, a scanning motor for driving said scanning means and a scanning transducer means comprising:
   a source of low voltage, substantially constant frequency pulses separated by a substantially constant time interval;
   high voltage isolation means having an input and an output;
   pulse control means coupled to said source and said input of said high voltage isolation means for controlling the application of pulses to said input; and
   a switching transistor having a base, an emitter and a collector, said transistor being characterized by a base storage time exceeding said time interval between said low voltage pulses, said base being coupled to said output of said isolation means so as to render said transistor conductive between said emitter and said collector during said pulses and during said intervals between said pulses and a power supply coupled to said transistor and said motor so as to apply power to said motor during the application of pulses to the base of the transistor.

6. The switching circuit of claim 5 wherein said pulse control means applies an open circuit to said input of said isolation means so as to interrupt the flow of DC current in said isolation means and render said transistor nonconductive between said collector and said emitter.

7. The switching circuit of claim 5 including a pair of said isolation means and a pair of said transistors coupled to each said output of said pair of isolation means, said pulse control means including means for alternately applying series of pulses to one and then the other of said pair of transistors so as to alternately render said pair of transistors conductive.

8. The switching circuit of claim 7 further comprising a pair of power supplies connected in series circuit with the emitter-collector circuits of said pair of transistors, said power supplies being connected with opposing polarities so as to generate an AC signal across said series circuit from a first terminal between said transistors and a second terminal between said power supplies.

9. The switching circuit of claim 8 wherein said pulse control means comprises:
   a pair of gate means respectively coupled to each said input of said pair of isolation means;
   means for alternately enabling said pair of gate means; and
   means for simultaneously inhibiting both of said pair of gate means immediately prior to enabling each said gate means.

10. The switching circuit of claim 9 wherein said means for alternately enabling said pair of gate means changes state while both said gate means are inhibited.

* * * * *